United States Patent [19]
Frankoski et al.

[11] Patent Number: 5,965,944
[45] Date of Patent: Oct. 12, 1999

[54] PRINTED CIRCUIT BOARDS FOR MOUNTING A SEMICONDUCTOR INTEGRATED CIRCUIT DIE

[75] Inventors: Edward Jay Frankoski, Newark Valley; Irving Memis, Vestal, both of N.Y.

[73] Assignee: International Business Machines Corporation, Armonk, N.Y.

[21] Appl. No.: 08/968,989

[22] Filed: Nov. 12, 1997

[51] Int. Cl.$^6$ ............... H05K 7/10; H01L 21/58
[52] U.S. Cl. ............ 257/779; 257/786; 257/772; 257/667; 257/673; 361/717; 361/718; 361/719; 361/720
[58] Field of Search ................... 361/717–720, 361/752; 257/779, 772, 667, 673, 786

[56] References Cited

U.S. PATENT DOCUMENTS

| | | | |
|---|---|---|---|
| 3,716,907 | 2/1973 | Anderson | 29/470 |
| 4,336,551 | 6/1982 | Fujita et al. | 357/80 |
| 5,075,965 | 12/1991 | Carey et al. | 29/840 |
| 5,090,609 | 2/1992 | Nakao et al. | 257/779 |
| 5,334,804 | 8/1994 | Love et al. | 257/784 |
| 5,436,412 | 7/1995 | Ahmad et al. | 174/265 |
| 5,523,920 | 6/1996 | Machuga et al. | 361/767 |
| 5,547,740 | 8/1996 | Higdon et al. | 428/209 |
| 5,614,056 | 3/1997 | Frankoski et al. | 156/345 |
| 5,729,435 | 3/1998 | Iijima et al. | 257/707 |
| 5,737,191 | 4/1998 | Horiuchi et al. | 257/783 |

*Primary Examiner*—Wael M. Fahmy
*Assistant Examiner*—Hung Van Duong
*Attorney, Agent, or Firm*—William N. Hogg

[57] ABSTRACT

The present invention provides printed circuit boards for mounting to a semiconductor integrated circuit die. In one embodiment the printed circuit boards comprise a rigid dielectric substrate having a planar face, a plurality of circuit lines affixed to the face of the substrate, and a plurality of conductive bumps affixed to the face of the substrate. Each conductive bump has an upper bonding surface that is substantially planar and a lateral surface which is essentially perpendicular to the face of the substrate. The conductive bumps and the circuit lines are formed from a single metallic layer. The conductive bumps and circuit lines constitute a unitary, integral structure, i.e., each conductive bump and connecting circuit line lack a physical interface therebetween. The upper surfaces of the conductive bumps extend to essentially the same height above the surface of the substrate, i.e., the upper surfaces of the conductive bumps are substantially coplanar relative to each other. In another embodiment, the printed circuit board further comprises a unitary solder dam or a plurality of unconnected solder dams that partially or completely surround the conductive bumps. The solder dam has an upper surface which lies below the upper bonding surface of the conductive bump. The solder dam is positioned to prevent the alloy, particularly solder, which is subsequently disposed on each conductive bump from flowing along the circuit lines that are integrally connected to the conductive bump. The present invention also relates to a microelectronic package that comprises a semiconductor integrated circuit die mounted to a printed circuit board made in accordance with the present invention.

17 Claims, 2 Drawing Sheets

PRINTED CIRCUIT BOARDS FOR MOUNTING A SEMICONDUCTOR INTEGRATED CIRCUIT DIE

FIELD OF THE INVENTION

This invention relates to a printed circuit board for mounting electrical components. More particularly, this invention relates to an improved printed circuit board having conductive bumps for attaching a semiconductor integrated circuit die to the board.

BACKGROUND OF THE INVENTION

Semiconductor integrated circuit dies typically are mounted onto printed circuit boards via a plurality of interconnections between solder bumps, which are affixed to the face of the die, and contact pads that are on a surface of the printed circuit board. The contact pads are in electrical communication with one or more circuit lines that are also present on the surface of the board. Typically, the contact pads and circuit lines are integrally formed from a single layer of copper.

To form the interconnections, a solder mask is first applied to the surface of the printed circuit board. The solder mask, which acts as an insulator, is formed from a polymeric material that is able to withstand the elevated temperatures to which it is exposed during subsequent assembly operation. Openings are formed in the solder mask to expose the upper surface of each of the contact pads. Thereafter, the solder bumps are aligned with the openings and brought into contact with the contact pads. The resulting assembly is heated to a temperature sufficient to melt the solder bumps and cause them to reflow over the corresponding contact pads. The presence of the solder mask prevents the molten solder from spreading along the circuit lines. Upon cooling, the solder resolidifies and bonds to the contact pad to complete the interconnection.

Unfortunately, it is very difficult to routinely form good interconnections between all of the solder bumps and contact pads using the above-described method. Poor electrical and mechanical connections often result from misalignment of the solder mask with the contact pads so that the contact pads are not centered in the openings. Poor connections can also result if the solder bumps are not all properly aligned with the openings in the solder mask. Because the solder bumps typically have non-uniform heights and because the solder mask itself sometimes has a non-uniform thickness, poor connections can result even when the contact pads, openings, and solder bumps are all properly aligned.

Electrical connections between printed circuit boards and semiconductor integrated circuit dies have also been achieved using conductive adhesives. Since conductive adhesives are considerably more viscous than molten solder, a solder mask is not needed. However, it is necessary that the printed circuit board be spaced apart from the die for a distance sufficient to prevent shorting between the die and circuitry and to provide stress relief. To achieve such distances conductive bumps must be formed on the surface of the printed circuit board. Unfortunately, poor interconnections can result if the upper surfaces of the bumps do not extend to essentially the same distance above the surface of the printed circuit board. In other words, poor interconnections can result if the upper surfaces of the bumps are not substantially co-planar.

Accordingly, it is desirable to have a new printed circuit board that overcomes these problems. A printed circuit board configured to provide a high density of uniformly good interconnections between the printed circuit board and the semiconductor integrated circuit die is especially desirable.

SUMMARY OF THE INVENTION

In accordance with the present invention, printed circuit boards for mounting to a semiconductor integrated circuit die are provided. In one embodiment the printed circuit board comprises a rigid dielectric substrate having a planar face, a plurality of circuit lines affixed to the face of the substrate, and a plurality of conductive bumps affixed to the face of the substrate, Each conductive bump has an upper bonding surface that is substantially planar and a lateral surface which is essentially perpendicular to the face of the substrate. The conductive bumps and the circuit lines are formed from a single metallic layer. Thus, the conductive bumps and circuit lines constitute a unitary, integral structure, i.e., each conductive bump and connecting circuit line lacks a physical interface therebetween. Because the conductive bumps are formed from a single substantially planar metallic layer, the upper surfaces of the conductive bumps extend to essentially the same height above the surface of the substrate, i.e., the upper surfaces of the conductive bumps are substantially coplanar relative to each other.

In another embodiment, the printed circuit board further comprises a unitary solder dam or a plurality of unconnected solder dams that partially or completely surround the conductive bumps. The solder dam has an upper surface which lies below the upper bonding surface of its respective conductive bump. The solder dam is positioned to prevent the alloy, particularly solder, which is subsequently disposed on each conductive bump from flowing along the circuit lines that are integrally connected to the conductive bump.

The present invention also relates to a microelectronic package that comprises a semiconductor integrated circuit die mounted to a printed circuit board made in accordance with the present invention.

BRIEF DESCRIPTION OF THE DRAWINGS

The present invention may be more readily understood by reference to the drawings wherein.

DETAILED DESCRIPTION OF THE INVENTION

Figure 1:
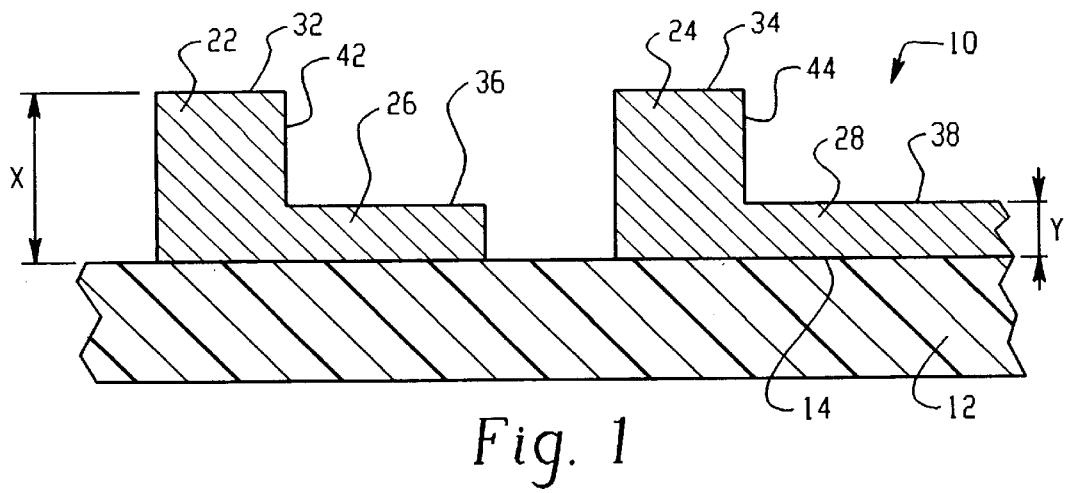
FIG. 1 is a cross-sectional view showing a printed circuit board comprising a conductive bump and a circuit line that lack a physical interface therebetween, in accordance with the present invention.

In accordance with the present invention, one embodiment of a printed circuit board 10 for mounting electronic components, particularly semiconductor integrated circuit dies, is shown in FIG. 1. Printed circuit board 10 comprises a rigid dielectric substrate 12, having a planar face 14. Examples of rigid dielectric substrates material suitable for use in the printed circuit board include epoxy-based materials and tetrafluoroethylene fluorocarbon-based materials. A conductive metal layer comprising a plurality of conductive bumps 22 and 24 and a plurality of circuit lines 26 and 28, is affixed to face 14 of the substrate. Conductive bumps 22 and 24 have top surfaces 32 and 34 respectively, which are substantially planar and which extend to essentially the same height (x) above face 14 of the substrate. Conductive bumps 22 and 24 have lateral surfaces 42 and 44 respectively, which are essentially perpendicular to face 14 of the substrate. Circuit lines 26 and 28 have upper surfaces 36 and 38 which extend to essentially the same height (y) above face 14. Because conductive bumps 22 and 24 are formed from the same metal layer during fabrication of printed circuit board 10, there is no interface between each conductive bump and its respective connecting circuit line. Thus, conductive bump 22 and circuit line 26 constitute a unitary, integral structure. Similarly, conductive bump 24 and circuit line 28 constitute a unitary, integral structure.

Printed circuit board 10 is made by applying a substantially planar metal layer to the planar face of a rigid dielectric substrate. Preferably, the metal layer is a copper layer. Although any standard technique such as evaporation, sputtering, or electrolyses plating, among others, may be used to apply the metal layer to the dielectric substrate, it is preferred that the metal layer be applied by laminating a metallic foil having a substantially uniform thickness to the substrate. Typically, such metallic foils have a uniform thickness requirement or tolerance of ±1 micron. Then a first photoresist is applied to the exposed surface of the metal layer. Suitable photoresists include negative photoresists, such as for example, McDermid Aquamer CFI or DF, Dupont Riston 9000, or Dupont Riston 4700. Application of the photoresist is usually made with a hot roll laminator or by wet lamination on a cut sheet laminator.

The first photoresist is then exposed through a mask, developed and stripped to remove portions thereof and to provide a pattern of remaining photoresist sections dispersed on top of the metal layer. The position and shape of these sections correspond to the desired location and shape of the intended conductive bumps. This photolithographic process exposes the portions of the copper layer from which the circuit lines are to be formed.

After stripping the developed portions of the resist, the exposed portions of the copper layer are then partially etched to second height(y). Second height(y) is equal to the desired height of the copper circuitry. Preferably, the exposed copper layer is etched by exposure to an aqueous solution of cupric chloride and hydrochloric acid. The exposed portions of the copper layer are treated with the etching agent for a time sufficient to reduce the height of the exposed portions of the metal layer to height (y).

Preferably, the exposed copper layer is etched by subjecting the exposed surface of the copper layer to treatment with an etching agent comprising cupric chloride in an aqueous hydrochloric acid solution at a temperature below 110° F. Preferably the etching agent comprises cupric ions at a concentration of from about 125 to 225 gm/liter of etching agent. Preferably, the concentration of hydrochloric acid in the etching agent is from about 1 to 2 N. Alternate etchants such as ferric chloride or sodium persulphate can also be used for low temperature etching of the bumps. The exposed portions of the copper layer are treated with the etching agent for a time sufficient to reduce the height of the exposed portions of the metal layer to the desired second height. The etching may be performed by dipping the metallized substrate in the etching agent or, preferably, by spraying the top surface thereof with the etching agent. It has been determined that the preferred etching process minimizes the undercutting of the conductive bumps that come into contact with the etching agent and provides the control needed to prevent thinning of the exposed portions of the copper layer beyond the desired second height. To permit monitoring of the reduction in height of the exposed copper layer, it is preferred that the multiple treatments be used. Preferably each treatment is less than one minute and the orientation of the panel is varied to improve uniformity of etching. Optimal process conditions can be determined using standard engineering experimental methods.

Once the exposed portions of the metal layer are etched to height (y) the remaining sections of the first photoresist are removed by a chemical stripping process. Then a second photoresist is electrodeposited onto the exposed surface of the metal layer. The second photoresist is imaged to provide a pattern of remaining second photoresist sections covering the intended conductive bumps and the intended copper circuit lines. Examples of a commercially available second photoresists include, but are not limited to, the positive electrodepositable photoresists Shipley PEPR 2400 and Nippon Paint 2,000. The exposed portions of the metal layer are then etched along the remaining resist. This second etching step may involve wet etching in which the exposed copper layer is treated with an etching agent such as cupric chloride. For a substrate comprising ceramic, silicone, or glass, a dry etching process may be used. Dry etching involves exposure to a plasma containing a reactive gas such as Ar or $CF_4$. Then remaining second resist is removed by conventional procedures such as by treating with a sodium hydroxide solution or commercial strippers such as DuPont Riston S 1100X stripper, to provide a printed circuit board comprising a rigid dielectric substrate, a plurality of conductive bumps disposed on a surface of the substrate, and a plurality of circuit lines disposed on the surface of the dielectric substrate. The circuit lines and conductive bumps are in electrical commercial, communication. Each conductive bump and its respective connecting circuit lines lack a physical interface therebetween.

Figure 2:
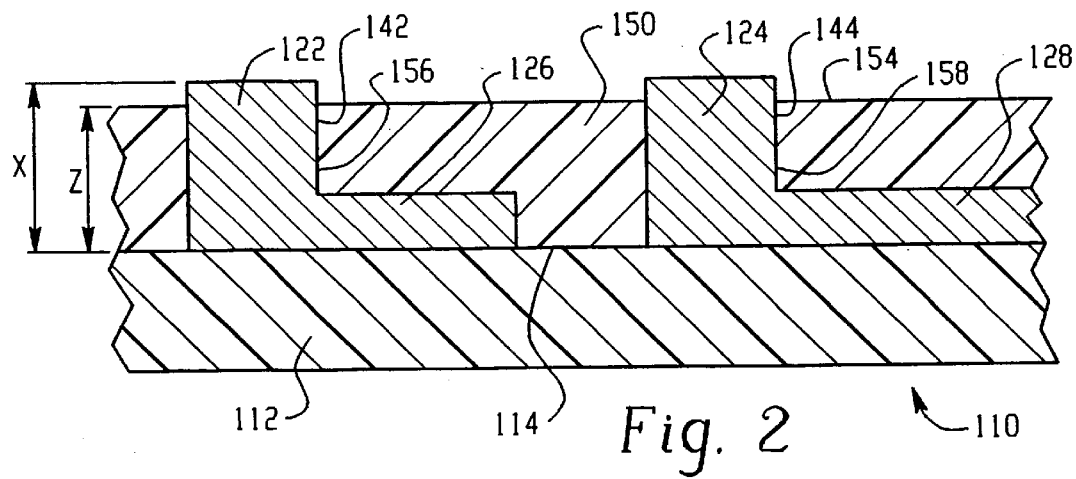
FIG. 2 is a cross-sectional view of a printed circuit board having a solder dam which completely surrounds a plurality of the conductive bumps of the printed circuit board.

In a second embodiment, printed circuit board 110 comprises a rigid dielectric substrate 112, a plurality of conductive bumps 122 and 124, a plurality of circuit lines 126 and 128, and a polymeric coating, referred to hereinafter as "a solder dam", which is configured to stop the flow of alloy, particularly solder, away from the conductive bumps during the reflow process. As shown in the embodiment of FIG. 2, solder dam 150 is disposed on face 114 of substrate 112 and overlies substantially all of circuit lines 126 and 128. Solder dam 150 has a top surface 154 which is substantially planar and which extends to height (z) above face 114, with height (z), preferably, being less than height (x) of conductive bumps 122 and 124. Solder dam 150 has side surfaces 156 and 158 which are generally perpendicular to face 114 and which define openings through which conductive bumps 122 and 124 extend. Side surfaces 156 and 158 of the solder dam may contact lateral surfaces 142 and 144 of the conductive bumps, as depicted in FIG. 2, or the side surfaces may be spaced apart from the lateral surfaces. Solder dam 150 is a continuous, unitary structure.

Solder dam 150 is applied following formation of the conductive bumps and circuit lines. The choice of material used to form solder dam 150 is dependent on its compatibility with subsequent processing conditions and its compatibility with the materials and components which make up the printed circuit board and semiconductor integrated circuit die. Suitable solder dams include, by way of example, liquid films, dry films, and screen printed solder masks. Due to the nature of the circuit bump topography, the small sizeof the bumps needed for attachment (5 mils on 10 mil centers) and the advantages that result from keeping at least a portion of the lateral surfaces of the conductive bumps free of contact with the solder dam, a liquid photoimageable solder mask (LPISM) is preferred. Following formation of the printed circuit board as depicted in FIG. 2, conductive bumps 122 and 124 are microetched in sodium persulfate and coated with Entek Plus to provide a structure having solderable conductive bumps.

Figure 3:
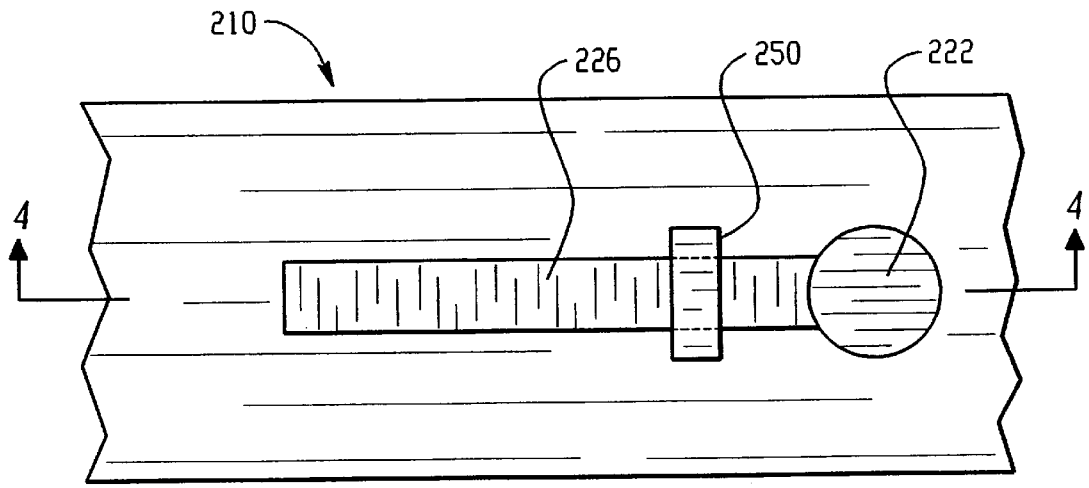
FIG. 3 is a plan view showing a printed circuit board comprising a solder dam that partially surrounds a conductive bump.
Figure 4:
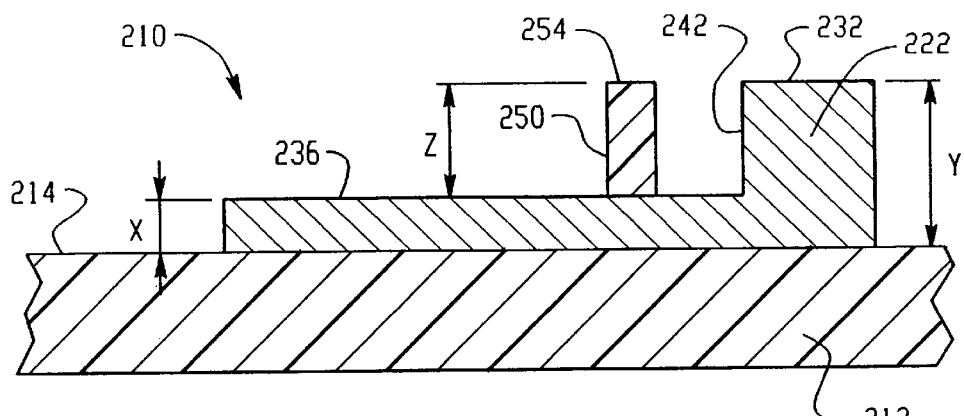
FIG. 4 is a cross-sectional view of the printed circuit board of FIG. 3 taken along the line 3—3 in the direction of the arrows.
Figure 5:
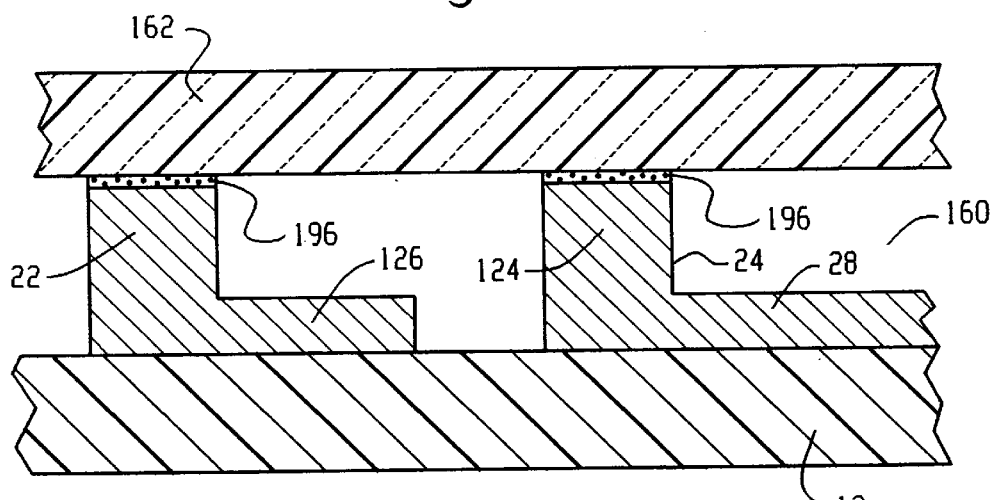
FIG. 5 is a cross-sectional view of a microelectronic package formed using the printed circuit board of FIG. 1.

In accordance with the present invention, a third embodiment of a printed circuit board 210 for mounting electronic components, particularly semiconductor integrated circuit dies, is shown in FIGS. 3 and 4. This printed circuit board, shown generally as 210, comprises a rigid dielectric substrate 212, having a planar face 214. A conductive metal layer comprising a plurality of conductive bumps and a plurality of conductive circuit lines is affixed to face 214 of the substrate. For purposes of illustration only one conductive bump 222 and one circuit line 226 are illustrated in FIGS. 2 and 3. Circuit line 226 has an upper surface 236 which extends to height (y) above face 214. Conductive bump 222 has a top surface 232 that is substantially planar and which extends to height (x) above face 214 of the substrate. Conductive bump 222 is integral with circuit line 226 and has a lateral surface 242 which is essentially perpendicular to circuit line 226. The conductive bumps and circuit lines of printed circuit board 210 are etched from a single metal layer, preferably a substantially planar copper layer, using the process described above for printed circuit board 10.

Printed circuit board 210 further comprises a plurality of unconnected solder dams that partially surround each of the conductive bumps of the printed circuit board. For purposes of illustration only one solder dam 250 is shown in FIGS. 3 and 4. Solder dam 250 have a top surface 254 which extends to height (z) above face 214. Although not necessary it is preferred that height (z) of solder dam 250 be less than height (x) of conductive bump 222, as depicted in FIG. 3. Preferably, the height (z) of solder dam 250 is less than the width and length of solder dam 250 to add stability thereto. Solder dam 250 overlies a portion of upper surface 236, circuit line 226 and a portion of face 214. Preferably, solder dam 250 is formed from a liquid photoimageable solder mask using conventional procedures known in the art.

Printed circuit boards configured in accordance with the present invention can provide a high density of conductive bumps, e.g. approximately, 10,000/square inch. Accordingly, the size of the dies connected to such printed circuit boards can be reduced. Moreover, because the conductive bumps have substantially coplanar upper surfaces, such circuit boards are well-suited for providing uniformly good interconnections between the printed circuit board and a semiconductor integrated circuit die.

FABRICATING THE SEMICONDUCTOR INTEGRATED CIRCUIT DIE PACKAGE

Printed circuit boards made in accordance with the present invention are useful for mounting semiconductor integrated circuit dies.

In one embodiment the resulting semiconductor die package shown generally as 160 lacks a solder mask and employs printed circuit board 10 as shown in FIG. 1. In addition to dielectric substrate 12, conductive bumps 22 and 24 and circuit lines 26 and 28, semiconductor package 160 further comprises a semiconductor integrated circuit die 162 having contact pads (not shown) for electrically connecting die 162 to printed circuit board 110, and a conductive adhesive 196 disposed between the contact pads of die 162 and conductive bumps 22 and 24. Suitable conductive adhesives include, but are not limited, to epoxy-based resins containing conductive fillers. The processes for connecting semiconductor dies to printed circuit boards via conductive adhesives are well-known in the art. Briefly, the process involves dispensing the conductive adhesive on the contact pad, aligning the contact pads with the conductive bumps, pressing the die and printed circuit board together under conditions of heat and pressure sufficient to cure the adhesive and to form interconnecting conductive paths between the contact pads and conductive bumps. Thus, the conductive adhesive provides an electrical and physical bond between the semiconductor integrated circuit die and the conductive bump of the printed circuit board.

The process for fabricating the semiconductor packages which comprises solder dams that partially or completely surround the conductive chips are nearly identical. Accordingly, for purposes of illustration the process of fabricating the semiconductor package will be described with reference to printed circuit board 110 as shown in FIG. 2 only.

Figure 6:
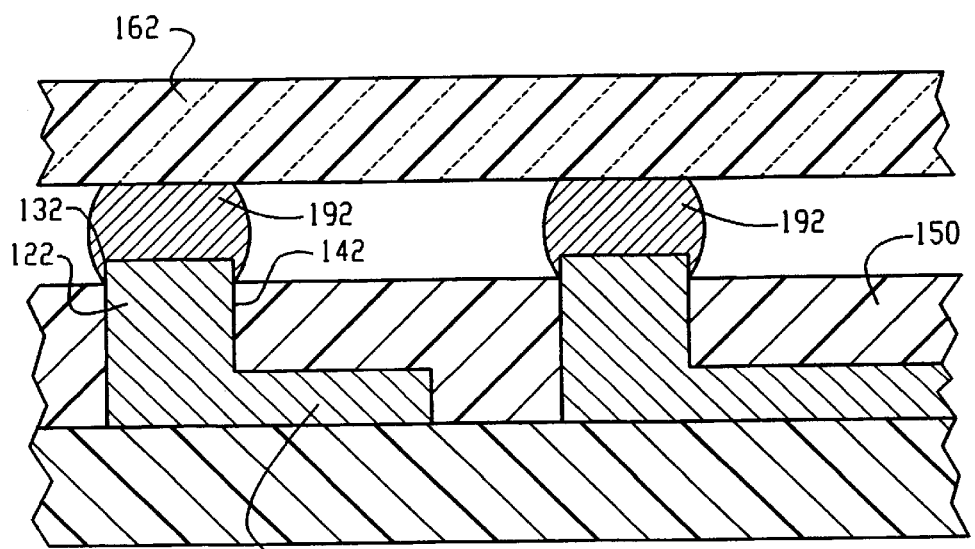
FIG. 6 is a cross-sectional view of a microelectronic package formed using the printed circuit board of FIG. 2.

Following formation of printed circuit board 110, a semiconductor integrated circuit die shown generally as 162 in FIG. 6 and having alloy bumps 192 is aligned with printed circuit board 110 such that the alloy bump 192 rests upon surface 132 of conductive bump 122. Alloys used for forming alloy bump include, by way of example, solder, preferably, a low melting, eutectic solder alloy. Alloy bump 192 can also comprise an indium alloy. The assembly is then heated to a temperature sufficient to melt the alloy and to cause the alloy to flow from alloy bump 192 over upper surface 132 and, preferably, at least a portion of lateral surface 142 of conductive bump 122. Solder dam 150 prevents the molten alloy from spreading along regions of circuit lines 126 that are covered by solder dam 150 and that are distal to conductive bump 122. Thereafter, the assembly is cooled, whereupon the alloy solidifies. The resulting semiconductor integrated circuit die assembly comprises a semiconductor integrated circuit die bonded to a printed circuit board via a plurality of conductive bumps that are in electrical communication with and integral with a plurality of circuit lines.

While the invention has been described to some degree of particularity, various adaptations and modifications can be made without departing from the scope of the invention as defined in the appended claims.

What is claimed is:

1. A printed circuit board for bonding to a semiconductor integrated circuit die, said printed circuit board comprising:
   (a) a rigid dielectric substrate having a planar face;
   (b) a circuit line affixed to the face of the substrate;
   (c) a conductive bump integral with said circuit line and affixed to the face of the substrate, said conductive bump having an upper bonding surface that is disposed above said circuit line and is substantially planar.

2. The printed circuit board of claim 1 wherein said circuit board comprises a plurality of conductive bumps, each of said plurality of bumps having a substantially planar upper bonding surface.

3. The printed circuit board of claim 1 further comprising a solder dam disposed on the circuitized face of the substrate, said solder dam at least partially surrounding the bump for preventing flow of solder away from the conductive bump and along the circuit line integrally connected to the conductive bump.

4. The printed circuit board of claim 1 further comprising a solder dam disposed on the circuitized face of the substrate and encircling the bump for preventing the flow of solder away from the conductive bump and along the circuit line integrally connected to the bump.

5. The printed circuit board of claim 3 wherein the solder dam has an upper surface, and wherein the upper bonding surface of the conductive bump is located at a greater distance away from the face of the substrate than the upper surface of the solder dam.

6. The printed circuit board of claim 4 wherein the solder dam has an upper surface, and wherein the upper bonding surface of the conductive bump is located at a greater distance away from the face of the substrate than the upper surface of the solder dam.

7. The printed circuit board of claim 2 further comprising a plurality of solder dams disposed on the printed circuit board, and wherein each of said plurality of conductive bumps is at least partially surrounded by a solder dam.

8. The printed circuit board of claim 2 further comprising a continuous solder dam, and wherein each of the plurality of bumps is at least partially surrounded by the solder dam.

9. The printed circuit board of claim 2 wherein the upper bonding surfaces of said plurality of conductive bumps extend to essentially the same height above the face of said substrate.

10. The printed circuit board of claim 7 wherein the upper bonding surfaces of said plurality of conductive bumps extend to essentially the same height above the face of said substrate.

11. The printed circuit board of claim 8 wherein the upper bonding surfaces of said plurality of conductive bumps extend to essentially the same height above the face of said substrate.

12. A semiconductor package, comprising
 (a) a semiconductor integrated circuit die;
 (b) a printed circuit board comprising:
  (i) a rigid dielectric substrate having a planar face;
  (ii) a circuit line affixed to the face of the substrate;
  (iii) a conductive bump integral with said circuit line and affixed to the face of the substrate, said conductive bump having an upper bonding surface that is disposed above said circuit line and is substantially planar; and
 (c) a conductive adhesive bonding the semiconductor integrated circuit die to the conductive bump of the printed circuit board.

13. The semiconductor package of claim 12, wherein the printed circuit board comprises a plurality of conductive bumps bonded to the semiconductor integrated circuit die by the conductive adhesive, said plurality of bumps having upper bonding surfaces that are substantially coplanar.

14. A semiconductor package, comprising
 (a) a semiconductor integrated circuit die;
 (b) a printed circuit board comprising:
  (i) a rigid dielectric substrate having a planar face;
  (ii) a circuit line affixed to the face of the substrate;
  (iii) a conductive bump integral with said circuit line and affixed to the face of the substrate, said conductive bump having an upper bonding surface that is disposed above said circuit line and is substantially planar;
 (c) a solder dam disposed on the circuitized face of said printed circuit board, said solder dam at least partially surrounding the conductive bump; and
 (d) an allow bump bonding the semiconductor integrated circuit die to the conductive bump of the printed circuit board.

15. The semiconductor package of claim 14 wherein the printed circuit board comprises a plurality of conductive bumps bonded to the semiconductor integrated circuit die by a plurality of alloy bumps; wherein a plurality of solder dams are disposed on the printed circuit board; and wherein each of said plurality of conductive bumps is at least partially surrounded by a solder dam.

16. The semiconductor package of claim 14 wherein the printed circuit board comprises a plurality of conductive bumps bonded to the semiconductor integrated circuit die by a plurality of alloy bumps; wherein a continuous solder dam is disposed on the printed circuit board; and wherein each of said plurality of conductive bumps is at least partially surrounded by the continuous solder dam.

17. The semiconductor package of claim 14 wherein the solder dam has an upper surface, and wherein the upper bonding surface of the conductive bump is located at a greater distance away from the surface of the substrate than the upper surface of the solder dam.

* * * * *